United States Patent [19]
Tanaka et al.

[11] Patent Number: 5,326,663
[45] Date of Patent: Jul. 5, 1994

[54] METHOD OF MANUFACTURING SHADOW MASK

[75] Inventors: Hiroshi Tanaka, Fukaya; Makoto Kudou; Katsumi Ichikawa, both of Kumagaya, all of Japan

[73] Assignee: Kabushiki Kaisha Toshiba, Kawasaki, Japan

[21] Appl. No.: 965,720

[22] Filed: Oct. 23, 1992

[30] Foreign Application Priority Data

Oct. 24, 1991 [JP] Japan .................................. 3-275923

[51] Int. Cl.$^5$ ................................................ G03C 5/00
[52] U.S. Cl. .......................................... 430/23; 430/28; 156/644
[58] Field of Search ...................... 430/23, 28, 29, 312, 430/313, 318; 156/644

[56] References Cited

U.S. PATENT DOCUMENTS 4,689,114  8/1987  Ohtake et al. ..................... 156/644

FOREIGN PATENT DOCUMENTS 3138380  6/1991  Japan .

Primary Examiner—Steve Rosasco
Attorney, Agent, or Firm—Cushman, Darby & Cushman

[57] ABSTRACT

According to this invention, there is provided an improved method of manufacturing a shadow mask obtained by independently etching both the surfaces of a metal substrate. After one surface is etched to form a first opening, an etching resistive agent composition containing an acrylic resin, casein, and a leveling agent is applied to the obtained opening to form an etching resistive layer. Subsequently, the other surface is etched to form a second opening in the other surface, and then the etching resistive layer is removed to cause the first and second openings to communicate with each other.

16 Claims, 3 Drawing Sheets

METHOD OF MANUFACTURING SHADOW MASK

BACKGROUND OF THE INVENTION

1. Field of the Invention

The present invention relates to a method of manufacturing a shadow mask used in a color picture tube and, more particularly, a method of manufacturing a shadow mask in which apertures for transmitting electron beams are formed by two-step etching.

2. Description of the Related Art

Shadow masks commonly used for color cathode ray tubes have a large number of apertures. These shadow masks are used to allow three electron beams each corresponding to red, green and blue emitted from the electron gun to impinge on each corresponding phosphor through the apertures.

A shadow mask according to the present invention is conventionally arranged in the following color picture tube.

The shadow-mask type color picture tube, as shown in FIG. 1, has an envelope constituted by a panel 1 and a funnel 2 integrally connected to the panel 1. A phosphor screen 3 constituted by tricolor phosphor layers is formed on the inner surface of the panel 1. A shadow mask 4 is arranged to be opposite to the phosphor screen 3 inside the panel 1.

The shadow mask 4 is formed by pressing in a predetermined various of curvature and a mask frame 10 welded to the peripheral portion of the shadow mask 4. The shadow mask 4 has a structure which selects three electron beams 7B, 7G, and 7R radiated from an electron gun 6 arranged in a neck 5 of the funnel 2 and allows these beams to be impinge on the tricolor phosphor layers. For this reason, a large number of apertures for transmitting electron beams are formed in the shadow mask 4 to have a predetermined arrangement. In addition, each of apertures 11 of the shadow mask 4 is formed such that a large opening 12 formed in one surface opposite to the phosphor screen communicates with a small opening 13 formed in the other surface as shown in FIG. 2 to decrease the amount of electron beams which collide with the inner walls of the apertures and are reflect in the undesired direction of the phosphor screen.

The shadow mask 4 is manufactured as follows. For example, apertures are perforated by photoetching in a shadow mask substrate such as a thin low-carbon steel plate having a thickness of, e.g., about 0.13 mm, a flat mask is made and this flat mask is formed by pressing after annealing.

Apertures are perforated in the shadow mask 4 as follows. First photoresist films are formed on both the surfaces of the shadow mask substrate. A pair of negative printing plates on which patterns of apertures each having predetermined shape and size are brought into contact with the photoresist films on both the surfaces of the shadow mask substrate, respectively, and the photoresist films are exposed. Thereafter, the patterns of the negative printing plates are printed and developed, thereby forming resist films having patterns corresponding to the patterns of the negative printing plates. The aperture patterns correspond to the large opening 12 and the small opening 13 which have the sections shown in FIG. 2, respectively. Thereafter, both the surfaces of the shadow mask substrate on which the large opening resist pattern layer and the small opening resist pattern layer are formed are simultaneously etched, thereby perforating apertures.

In recent years, a high-definition color picture tube has been developed. In accordance with this, a shadow mask having a small aperture diameter has been demanded. In contrast to a method of manufacturing a conventional shadow mask, a method called two-step etching disclosed in Japanese Patent Application No. 58-176378 is known as a method used for manufacturing a shadow mask having a small aperture diameter and used in the high-definition color picture tube. According to this method, as in the conventional method of manufacturing a shadow mask, photoresist films are formed on both the surfaces of a shadow mask substrate, negative printing plates are brought into contact with the photoresist films, respectively, and the photoresist photosensitive films are exposed and developed, thereby forming etching masks having patterns corresponding to the patterns of the negative printing plates. Thereafter, as the first etching, a protection film is adhered to one surface of the shadow mask substrate on which a large-opening resist pattern is formed. The other surface on which a small-opening resist pattern layer is formed is etched to form recesses of small openings. Thereafter, the small-opening resist pattern layer is removed, and an etching resistive agent containing an epoxy resin, casein, and a leveling agent as main components is coated on the small opening-side, thereby forming an etching resistive layer. In addition, the protection film adhered to the large-opening resist pattern layer is peeled. Thereafter, as the second etching, the large-opening side is etched to cause the large openings to communicate with the small openings, thereby forming apertures.

In a conventional single-step etching, an etching solution flows into an aperture rapidly as soon as the aperture is dug through by etching and passes through an aperture freely after communicating the large opening with the small openings, thereby undesired large aperture may be formed.

On the other hand, when the above two-step etching is used, since the etching resistive layer also prevents an etching solution to pass through an aperture, highly precise apertures can be obtained even when each of the apertures is designed to have a diameter smaller than that of the aperture obtained by conventional etching.

As described above, in the two-step etching, when the large-opening side is etched, the small openings side must be protected from etching. More specifically, as an etching resistive layer for protecting the small opening side during the second etching, an etching resistive agent containing an epoxy resin, casein, and a leveling agent as main components is often used. However, this etching resistive agent is not easily removed after the apertures are formed, and the formed apertures clog with the etching resistive agent.

A caustic solution is generally used to remove the etching resistive layer. However, since the etching resistive layer does not dissolve in the caustic solution, it is not easily removed. The removed etching resistive layer is suspended in the solution and attached to the shadow mask substrate, thereby easily clogging the formed apertures in the substrate.

SUMMARY OF THE INVENTION

The present invention has been made to improve a method of manufacturing a shadow mask using two-step etching, and has as its object to obtain a method of manufacturing a shadow mask which allows an etching resistive layer in use to be easily removed without degrading etching resistance to prevent apertures from clogging.

According to the present invention, there is provided a method of manufacturing a shadow mask having a first major surface and a second major surface and a plurality of apertures, the apertures having different opening sizes on the first and second major surfaces, comprising the steps of:

(i) forming photoresist layers on the first and second major surfaces of a metal substrate, respectively;

(ii) exposing and developing the photoresist layers of the first and second major surfaces to form a first opening resist pattern on the first major surface and to form a second opening resist pattern different from the first opening pattern in size on the second major surface;

(iii) etching the first major surface to from first openings;

(iv) after the first opening resist pattern layer is removed, applying an etching resistive agent composition containing an acrylic resin, casein, and a leveling agent to the first major surface to form an etching resistive layer;

(v) etching the second major surface to form second openings different from the first openings in size; and (vi) removing the etching resistive layer and the second opening resist pattern layer, thereby forming apertures each having the first and second openings communicating with each other.

In the method of manufacturing a shadow mask according to the present invention, the composition containing an acrylic resin, casein, and a leveling agent as main components is used as an etching resistive agent. An etching resistive layer obtained by coating the etching resistive agent has a sufficient etching resistance and can be dissolved in a caustic solution. For this reason, the step of removing the etching resistive film is facilitated. Unlike the shadow mask obtained in the prior art, the residue of the removed etching resistive film does not clog the apertures.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

A method of manufacturing a shadow mask according to the present invention is obtained by improving the steps of etching an aperture for an electron beam passing through using a two-step etching method.

According to the two-step etching method, the first etching is done from only one surface, and the first openings are formed in this one surface. The photoresist layer on the surface is removed, and an etching resistive agent is coated in the first openings and on the surface of first etching side thereby forming an etching resistive layer. The shadow mask substrate is etched from the other surface to expose the etching resistive layer formed in the first openings. The etching resistive layer is removed to cause the first openings to communicate with the second openings.

In the present invention, a composition containing an acrylic resin, casein, and a leveling agent as main components is used as the etching resistive agent.

A preferable embodiment of a method of manufacturing a shadow mask according to the present invention will be described below with reference to the accompanying drawings.

FIGS. 3A to 3H are sectional views showing the steps of forming apertures in a shadow mask substrate.

Figure 3A:
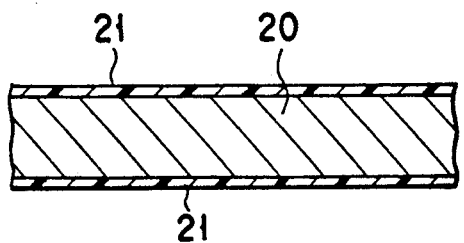
FIGS. 3A to 3H are sectional views showing the steps of forming an aperture in the shadow mask.

As shown in FIG. 3A, a long band-like aluminum killed low-carbon steel plate having smooth surfaces and a thickness of about 0.13 mm is prepared as a shadow mask substrate 20. After this shadow mask substrate 20 is degreased and washed, a photoresist solution containing milk caseinate and ammonium dichromate as main components is coated on both the surfaces of the shadow mask substrate and dried to form photoresist films 21 each having a thickness of about 5 μm.

Figure 1:
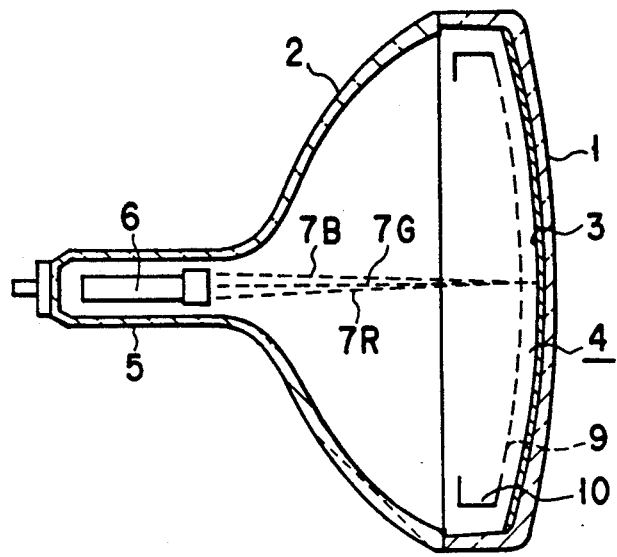
FIG. 1 is a view showing the arrangement of a color cathode ray tube to which a shadow mask according to the present invention can be applied.
Figure 2:
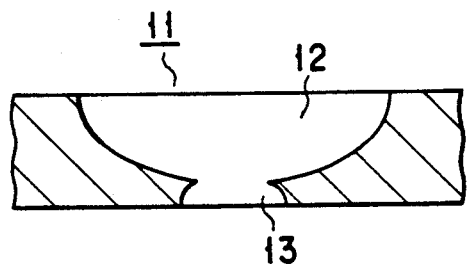
FIG. 2 is a sectional view showing an aperture of the shadow mask according to the present invention.
Figure 3B:
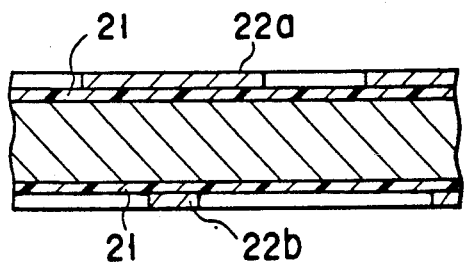
Figure 3C:
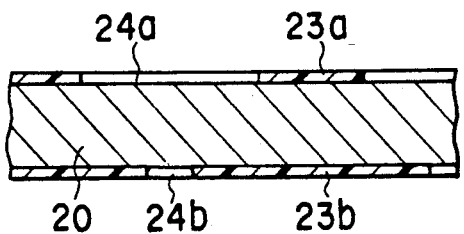

As shown in FIG. 3B, predetermined patterns are printed on the photoresist films 21 of both the surfaces of the shadow mask substrate, respectively. These patterns correspond to regions in which each openings to be manufactured on both the surfaces of a shadow mask can be formed, i.e., regions in which a large opening 12 and a small opening 13 shown in FIG. 2 can be formed, respectively. In order to obtain the patterns for positioning these regions, a pair of negative printing plates 22a and 22b on which the patterns having different opening sizes are respectively formed are used. In each of the patterns, the diameter of the opening is set to be properly smaller than that of an actual opening formed by etching because of the following reason. That is, an etching solution overetches the substrate under the photoresist films in the etching step, such that the diameter of the actually obtained opening becomes larger than that of the opening of a corresponding one of the patterns. These negative printing plates 22a and 22b are brought into tight contact with the photoresist films and exposed, such that the patterns of the pair of negative printing plates 22a and 22b are printed on the photoresist films 21 on both the surfaces of the shadow mask substrate. As shown in FIG. 3C, the photoresist films on which the patterns are printed are developed, and nonexposed portions are removed, thereby forming resist films 23a and 23b constituted by patterns corresponding to the patterns of the pair of negative printing plates, respectively. In the patterns of the resist films 23a and 23b, a portion for forming an aperture is defined by exposing portions 24a and 24b, and the exposing portion 24a of the resist film 23a on one surface of the shadow mask substrate 20 exposes a surface area of the shadow mask substrate larger than that of the exposing portion 24b of the resist film 23b on the other surface. In order to increase the etching resistance of the resist films 23a and 23b as needed, the resist films 23a and 23b are burnt in an atmosphere of about 150° C. for about 2 minutes.

Figure 3D:
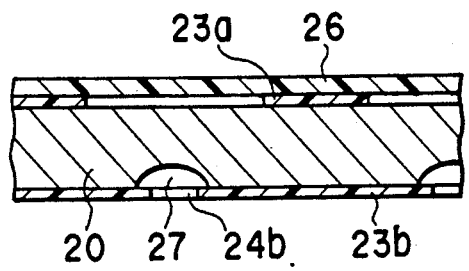
Figure 3E:
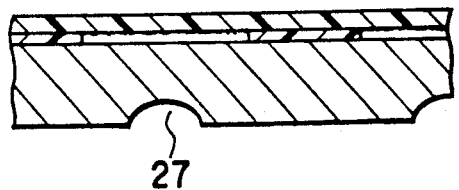

As shown in FIG. 3D, a protection film 26 consisting of a polyethylene, polypropylene, or polyvinyl chloride resin is adhered to the resist film 23a having the large-diameter opening pattern of the shadow mask substrate 20. Thereafter, the other surface on which the resist film 23b having small-diameter opening pattern is formed is set to face downward, an etching solution containing ferric chloride as a main component is sprayed upward to the other surface to form a small opening 27 in the exposing portion 24b of the resist film 23b (first etching). Thereafter, as shown in FIG. 3E, the other surface in which the small opening 27 is formed is washed with water, and a caustic solution having a concentration of 15 wt % and a temperature of 60° C. is sprayed on the other surface to remove the resist film on the other surface. The substrate surfaces are washed with water and temporarily dried.

Figure 3F:
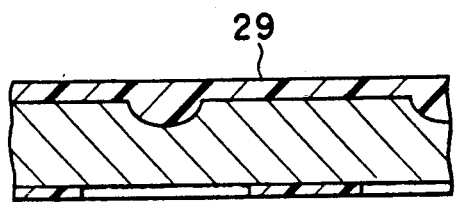

As shown in FIG. 3F, the other surface having small openings from which the resist film is removed is set to face upward, and an etching resistive agent containing acrylic resin, casein, and Additol (serving as a leveling agent) as main components is coated on the other surface by a roll coater. Thereafter, the protection film adhered to one surface is removed, and the coated etching resistive agent is dried to form an etching resistive film 29. The substrate is kept substantially horizontal from the step of coating the etching resistive agent to the step of drying the etching resistive agent. The etching resistive layer 29 is coated and formed to be sufficiently buried in the small opening and cover on the other surface. The etching resistive layer 29 has a thickness about 7 μm. The thickness of the etching resistive layer preferably ranges from 5 to 10 μm. If the thickness is less than 5 μm, breakages of the etch resistive layer occur. If the thickness exceeds 10 μm, bubbles are trapped in the etching resistive layer and defects, of aperture occur. In addition to the coating by the roll coater, the etching resistive agent can also be coated by a spray, dipping, and a bar coater.

Figure 3G:
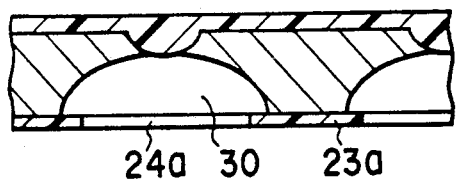
Figure 3H:
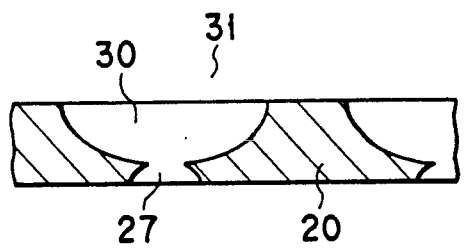

As shown in FIG. 3G, one surface is set to face downward, an etching solution containing ferric chloride as a main component is sprayed on this one surface, and an opening 30 which communicates with the small opening 27 is formed in the exposing portion 24a of the resist film 23a (second etching). After the substrate is washed with water, a caustic solution is sprayed on the substrate to dissolve and remove the resist film 23a on one surface in which the large opening 30 is formed and the etching resistive layer 29 formed on the other surface, and the substrate is washed with water again. Examples of materials comprised in the caustic solution are sodium hydroxide, potassium hydroxide, sodium carbonate, and sodium silicate. In this manner, as shown in FIG. 3H, a so-called flat mask in which an aperture 31 having the large opening 30 formed from one surface of the shadow mask substrate 20 and the small opening 27 formed from the other surface is formed can be obtained.

Note that a shadow mask to be incorporated in a color picture tube is manufactured as follows. That is, the above flat mask is press-molded in a predetermined shape, and the molded mask main body is welded to a mask frame which is separately molded.

Figure 4:
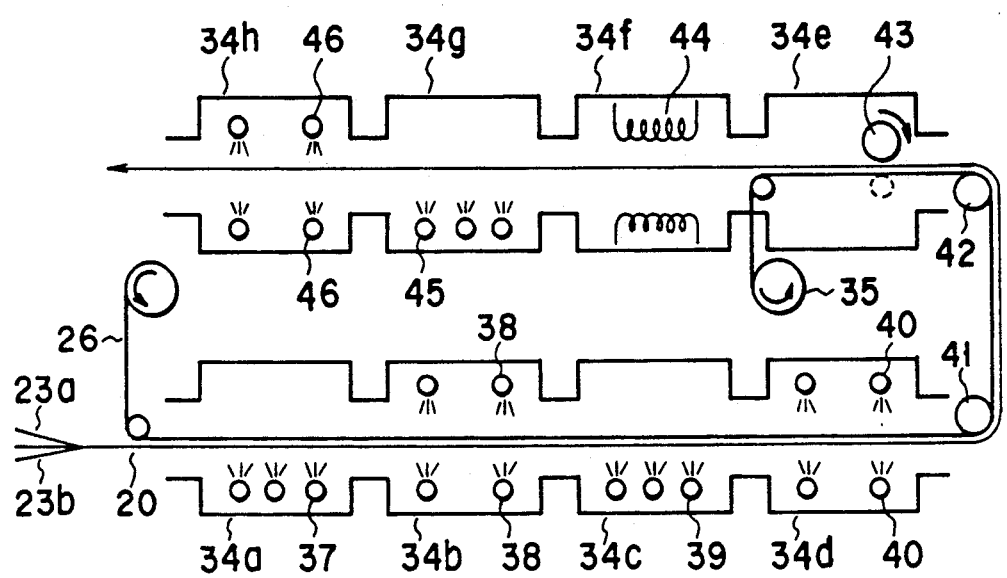
FIG. 4 is a sectional view showing an etching apparatus used for manufacturing a shadow mask.

FIG. 4 shows an etching apparatus for forming an aperture in a shadow mask substrate by the above method. This etching apparatus has a convey mechanism (not shown). In this convey mechanism, the long band-like shadow mask substrate 20 which is wound like a hoop and in which the resist films 23a and 23b are formed on both the surfaces travels and then is wound. A plurality of chambers 34a to 34h are arranged to communicate with each other along the traveling path of the shadow mask substrate 20. In addition, a protection film supply mechanism 35 is arranged along the traveling path of the shadow mask substrate 20. The protection film supply mechanism 35 supplies the protection film 26 adhered to the resist film 23a formed on one surface (to be referred to as the second surface hereinafter) of the shadow mask substrate 20, and removes and winds the protection film 26 before the second etching is performed.

The shadow mask substrate 20 wound like a hoop is continuously conveyed while the other surface (to be referred to as the first surface hereinafter) on which the resist film 23b is formed faces downward. First, a protection film supply means adheres the protection film 26 to the second surface of the shadow mask substrate 20 on which the resist film 23a is formed. Thereafter, the shadow mask substrate 20 is conveyed to the first chamber 34a located on the downstream side of the protection film supply means. The shadow mask substrate 20 is etched by an etching solution sprayed upward from a plurality of spray nozzles 37 arranged at the lower portion in the first chamber 34a to form small openings in the first surface facing downward. The shadow mask substrate 20 is conveyed to the second chamber 34b adjacent to the first chamber 34a, and it is washed with water sprayed from a plurality of spray nozzles 38 arranged at the upper and lower portions in the second chamber 34b. The shadow mask substrate 20 is conveyed to the third chamber 34c, and the resist film 23b formed on the first surface is removed by a caustic solution, e.g., a water solution of sodium hydroxide, sprayed from a plurality of spray nozzles 39 arranged at the lower portion in the third chamber 34c. Thereafter, the shadow mask substrate 20 is conveyed to the fourth chamber 34d. The shadow mask substrate 20 is washed with water sprayed from a plurality of spray nozzles 40 arranged at the upper and lower portions in the fourth chamber 34d, and is dried by a heater (not shown).

Thereafter, the shadow mask substrate 20 is reversed through convey rollers 41 and 42 to cause the first surface from which the resist film is removed to face upward, and an etching resistive agent containing an acrylic resin, casein, and a leveling agent as main components is coated on the second surface by a roll coater 43 arranged in the fifth chamber 34e. After the etching resistive agent is coated, the protection film 26 adhered to the second surface is removed. The protection film 26 may be removed at any time in a period from the end of the first etching to the start of the second etching. However, when the protection film 26 is adhered to the second surface until the coating of the etching resistive agent is finished, the second surface can be prevented from being attached by the etching resistive agent. After the protection film 26 is removed, the coated etching resistive agent is dried by a heater 44 arranged in the sixth chamber 34f to form an etching resistive layer.

The second surface of the shadow mask substrate 20 is etched from the lower direction by an etching solution sprayed from a plurality of spray nozzles 45 arranged at the lower portion in the seventh chamber 34g adjacent to the sixth chamber 34f to form large openings in the lower surface of the shadow mask substrate 20. Thereafter, the resist film formed on the second surface and the etching resistive layer formed on the first surface are dissolved and removed by a caustic solution which is the same as that of the third chamber and sprayed from a plurality of spray nozzles 46 arranged at the upper and lower portions in the eighth chamber 34h. In addition, the obtained shadow mask substrate 20 is dried by a heater (not shown).

Note that the etching resistive agent used in the above embodiment has the following composition.

| Etching resistive agent | | |
| --- | --- | --- |
| Backcoat 91 (tradename) available from Fuji Yakuhin Kogyo | Acrylic resin | 6.0 wt % |
| | Casein | 4.9 wt % |
| | Alkali agent | 0.82 wt % |
| available from | water | 88.1 wt % |
| | Leveling agent Additol XW395 (tradename) available from Hoechst Japan | 0.13 wt % |

The etching resistive agent used in the method of manufacturing the shadow mask according to the present invention contains an acrylic resin, casein, and a leveling agent as main components.

The acrylic resin may be a acrylate polymer, a methacrylate polymer, and a copolymer thereof. As the acrylic resin, for example, poly(methyl acrylate), poly(etchyl carylate), poly(-n-butyl acrylate), poly(methyl methacrylate), and the like can be used.

Casein is a phosphoprotein contained in milk at about 3%, and it generally forms a composite together with calcium in milk. Casein is present as colloidal particles in milk. In addition, casein is not a single protein but a conjugated protein consisting of three proteins, i.e., α-casein, β-casein, and γ-casein. In this case, a photoresist film using an optical reaction between the casein and ammonium dichromate can be used. As the photoresist film, for example, FR-15, FR-16, and FR-17 (available from Fuji Yakuhin Kogyo) and MR-SG, MR-SGM, and MR-SLG (available from Moroboshi Ink) are known.

The leveling agent is added to a coating solution to improve the surface quality of a coating. For example, Additol XW395 consists of 50 wt % of acrylate, 50 wt % of a solution mixture of butanol, ethyl glycol, and water. By adding the leveling agent, defects of the coating and nonuniform humidity caused by the presence of an foreign substance can be prevented, thereby obtaining the uniform coating.

The etching resistive agent preferably contains 4.0 to 7.0 wt % of an acrylic agent. If the content of the acrylic agent is less than 4.0 wt %, adhesion with a mask substrate and etching resistivity are deteriorated; and if the content exceeds 7.0 wt %, it tends to be difficult to remove an etching resistive layer from the mask substrate after etching.

The etching resistive agent preferably contains 4.4 to 5.4 wt % of casein. If the content of the casein is less than 4.4 wt %, it tend to be difficult to remove an etching resistive layer from the mask substrate; and if the content exceeds 5.4 wt %, it tends to adhesion with a mask substrate and etching resistivity are deteriorated.

The etching resistive agent preferably contains 0.08 to 0.18 wt % of a leveling agent. If the content of the leveling agent is less than 0.08 wt %, it tend to difficult to prevent ununiform wettability due to defects and aliens; and if the content exceeds 0.18 wt % it tends to decrease in flowability and deteriorate in leveling characteristics.

Since the etching resistive layer used in the present invention is dissolved in a caustic solution, it can be easily removed from the shadow mask substrate. Since an etching resistive layer used in a conventional method of manufacturing a shadow mask is not dissolved in a caustic solution, the removed etching resistive layer is suspended in the caustic solution and is adhered to a flat mask, thereby clogging apertures. However, when the etching resistive layer used in the present invention is used, such a drawback can be prevented. For this reason, high-quality shadow masks can be manufactured at a high yield.

According to the above method, small openings are formed first, and then large openings are formed. However, the present invention can be applied to a case wherein large openings are formed first, and then small openings are formed.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a shadow mask having first and second major surfaces and a plurality of apertures, said apertures having different opening sizes on said first and second major surfaces, comprising the steps of:

(i) forming photoresist layers on said first and second major surfaces of a metal substrate, respectively;

(ii) exposing and developing said photoresist layers of said first and second major surfaces to form a first opening resist pattern layer on said first major surface, and to form a second opening resist pattern layer which is different in size from said first opening resist pattern on said second major surface;

(iii) etching the first major surface to form first openings;

(iv) after the first opening resist pattern layer is removed, applying an etching resistive agent composition containing an acrylic resin, casein, and a leveling agent to said first major surface to form an etching resistive layer;

(v) etching the second major surface to form second openings which are different from said first openings in size; and (vi) removing said etching resistive layer and the second opening resist pattern layer, thereby forming said apertures, each having said first and second openings for communicating with each other.

2. A method according to claim 1, wherein the etching resistive agent composition contains 4.0 to 7.0 wt % of the acrylic resin.

3. A method according to claim 1, wherein the etching resistive agent composition contains 4.4 to 5.4 wt % of the casein.

4. A method according to claim 1, wherein the etching resistive agent composition contains 0.08 to 0.18 wt % of the leveling agent.

5. A method according to claim 1, wherein said first opening is larger than said second opening in diameter.

6. A method according to claim 1, wherein said first opening is smaller than said second opening in diameter.

7. A method according to claim 1, wherein the etching resistive agent composition is coated by at least one method selected from the group consisting of a roll coater method, spraying, dipping, and a bar coater method.

8. A method according to claim 1, wherein the etching resistive agent is coated and dried while said metal substrate is kept substantially horizontal.

9. A method according to claim 1, wherein the step (iii) comprises the step of etching said first major surface performed by spraying an etching solution upward while said first major surface faces downward.

10. A method according to claim 9, wherein the step (iv) is performed after said metal substrate is reversed.

11. A method according to claim 10, wherein the step (v) comprises the step of etching said second major surface performed by spraying an etching solution upward while said second major surface faces downward.

12. A method according to claim 1, further comprising the step of forming a protection film on said second major surface having an exposed second opening pattern.

13. A method according to claim 12, further comprising the step of removing said protection film after the etching resistive agent composition is applied.

14. A method according to claim 12, further comprising the step of removing said protection film after said first opening is formed.

15. A method according to claim 1, wherein said protection film is a film consisting of one resin selected from the group consisting of polyethylene, polypropylene, and polyvinyl chloride.

16. A method according to claim 1, wherein the step (vi) is performed by using at least one caustic solution comprising a compound selected from the group consisting of sodium hydroxide, potassium hydroxide, sodium carbonate, and sodium silicate.

* * * * *